(12) United States Patent
Kang

(10) Patent No.: US 8,765,564 B2
(45) Date of Patent: Jul. 1, 2014

(54) METHODS OF FORMING VARIABLE RESISTIVE MEMORY DEVICES

(75) Inventor: Myung Jin Kang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 133 days.

(21) Appl. No.: 13/495,529

(22) Filed: Jun. 13, 2012

(65) Prior Publication Data

US 2012/0315737 A1 Dec. 13, 2012

(30) Foreign Application Priority Data

Jun. 13, 2011 (KR) .................. 10-2011-0056992

(51) Int. Cl.
*H01L 21/20* (2006.01)
*H01L 45/00* (2006.01)

(52) U.S. Cl.
CPC ........ *H01L 45/1683* (2013.01); *H01L 45/1608* (2013.01); *H01L 45/16* (2013.01)
USPC ........................................ 438/381

(58) Field of Classification Search
None
See application file for complete search history.

(56) References Cited

U.S. PATENT DOCUMENTS

| 7,220,983 | B2 | 5/2007 | Lung | |
|---|---|---|---|---|
| 7,981,797 | B2 * | 7/2011 | Ryu et al. | 438/675 |
| 8,468,692 | B2 * | 6/2013 | Kim | 29/846 |
| 2010/0308296 | A1 | 12/2010 | Pirovano et al. | |
| 2012/0051124 | A1 * | 3/2012 | Tang | 365/163 |

FOREIGN PATENT DOCUMENTS

KR 10-2010-0032583 A 3/2010

* cited by examiner

*Primary Examiner* — Charles Garber
*Assistant Examiner* — Brigitte Paterson
(74) *Attorney, Agent, or Firm* — Lee & Morse, P.C.

(57) ABSTRACT

A method of forming a variable resistive memory device includes forming a conductive pattern that alternates with a first insulation pattern along a first direction on a substrate that is parallel with a surface of the substrate, forming a preliminary sacrificial pattern on the conductive pattern that contacts a sidewall of the first insulation pattern, etching the conductive pattern using the preliminary sacrificial pattern as an etch masks to form a preliminary bottom electrode pattern, patterning the preliminary sacrificial pattern and the preliminary bottom electrode pattern to form a sacrificial pattern and a bottom electrode pattern that each include at least two portions which are separated from each other along a second direction intersecting the first direction, and replacing the sacrificial pattern with a variable resistive pattern.

16 Claims, 25 Drawing Sheets

METHODS OF FORMING VARIABLE RESISTIVE MEMORY DEVICES

CROSS-REFERENCE TO RELATED APPLICATION

Korean Patent Application No. 10-2011-0056992, filed on Jun. 13, 2011, in the Korean Intellectual Property Office, and entitled: "Methods of Forming Variable Resistive Memory Devices," is incorporated by reference herein in its entirety.

BACKGROUND

1. Field

Embodiments relate to methods of forming semiconductor devices and, more particularly, to methods of forming variable resistive memory devices.

2. Description of the Related Art

Semiconductor devices can be, e.g., semiconductor memory devices and semiconductor logic devices. The semiconductor memory devices may store data. The semiconductor memory devices may be categorized as, e.g., volatile memory device and nonvolatile memory devices. Volatile memory devices may lose their stored data when their power supply is interrupted. Nonvolatile memory devices may retain their stored data even when their power supply is interrupted. The nonvolatile memory devices may include, e.g., programmable read only memory (PROM) devices, erasable PROM (EPROM) devices, electrical EPROM (EEPROM) devices and flash memory devices.

Semiconductor memory devices may also include, for example, ferroelectric random access memory (FRAM) devices, magnetic random access memory (MRAM) devices and phase-change random access memory (PRAM) devices. Memory cells may include a variable resistive material, which may have a characteristic that the electrical resistance of the material varies according to current or voltage applied thereto. Further, when included as part of a memory cell, the variable resistive material may retain its final electrical resistance even though the current and/or voltage supply is interrupted.

SUMMARY

Embodiments are directed to forming variable resistive memory devices.

Embodiments may be realized by a method that includes forming a conductive pattern and a first insulation pattern on a substrate, such that the conductive pattern alternates with the first insulation pattern along a first direction on a substrate, the first direction being parallel with a surface of the substrate, forming a preliminary sacrificial pattern on the conductive pattern, such that the preliminary sacrificial pattern contacts a sidewall of the first insulation pattern, etching the conductive pattern using the preliminary sacrificial pattern as an etch mask, thereby forming a preliminary bottom electrode pattern, patterning the preliminary sacrificial pattern and the preliminary bottom electrode pattern to form a sacrificial pattern and a bottom electrode pattern, such that at least two portions of the sacrificial pattern are separated from each other along a second direction intersecting the first direction, and at least two portions of the bottom electrode pattern are separated from each other along the second direction, and replacing the sacrificial pattern with a variable resistive pattern.

In an embodiment, the method may further include forming a second insulation pattern covering a sidewall of the preliminary sacrificial pattern prior to formation of the preliminary bottom electrode pattern, wherein etching the conductive pattern may include using the second insulation pattern as an etch mask together with the preliminary sacrificial pattern.

In an embodiment, the method may further include forming top electrode pattern on the variable resistive pattern.

In an embodiment, a sidewall of the conductive pattern may be in contact with a sidewall of the first insulation pattern, and a top surface of the first insulation pattern may be located above a top surface of the conductive pattern.

In an embodiment, the method may further include forming an interlayer insulation pattern between the substrate and the conductive pattern, such that the interlayer insulation pattern includes openings that expose a portion of the substrate, and selection elements may be formed in the respective openings.

In an embodiment, the selection elements may be arrayed in at least two columns that are parallel with the second direction when viewed from a plan view, and forming the conductive pattern may include forming portions of the conductive pattern such that each of the portions of the conductive pattern at least partially overlaps a first selection element and a second selection element, the first and second selection elements being from respective first and second columns of the at least two columns.

In an embodiment, forming the conductive pattern and the first insulation pattern may include forming a conductive layer on the substrate including the selection elements, forming a third insulation pattern on the conductive layer, such that the third insulation pattern extends along the second direction, patterning the conductive layer using the third insulation pattern as an etch mask to form the conductive pattern, forming the first insulation pattern between portions of the third insulation pattern and removing the third insulation pattern to form a trench that exposes the conductive pattern.

In an embodiment, the method may further include forming an ohmic pattern in the respective openings, such that the ohmic pattern is between the respective selection elements and the conductive pattern.

In an embodiment, etching the conductive pattern to form a preliminary bottom electrode pattern may include at least partially etching an upper portion of the ohmic pattern and an upper portion of the interlayer insulation layer.

In an embodiment, the third insulation pattern may be formed of a material having an etch selectivity with respect to the first insulation pattern.

In an embodiment, after forming the preliminary bottom electrode pattern, the trench may extend into a region between two portions of the preliminary bottom electrode pattern, and a fourth insulation pattern may be formed that fills the trench.

In an embodiment, forming the fourth insulation patterns may include exposing the preliminary sacrificial pattern using a planarization process.

In an embodiment, the sacrificial pattern may be formed of a material having an etch selectivity with respect to the first, second and fourth insulation pattern.

In an embodiment, forming the conductive layer may include sequentially forming first and second conductive layers on the substrate having the selection elements, and the second conductive layer may be formed of a material having a resistivity greater than a resistivity of the first conductive layer.

In an embodiment, the preliminary sacrificial patterns may be formed to contact the sidewall of the first insulation pattern using a spacer formation process.

In an embodiment, etching the conductive pattern may include etching the portions of the conductive pattern such that each of the portions of the conductive pattern is formed into at least two portions of the preliminary bottom electrode pattern.

Embodiments may be realized by a method that includes forming a first insulation pattern on a substrate, such that the first insulation pattern includes portions on either side of a trench, forming a preliminary sacrificial pattern, such that a portion of the preliminary sacrificial pattern is in the trench and contacts a sidewall of at least one of the portions of the first insulation pattern, and replacing the sacrificial pattern with a variable resistive pattern.

In an embodiment, the preliminary sacrificial pattern may be formed such that a first sidewall of the portion of the preliminary sacrificial pattern contacts a sidewall of at least one of the portions of the first insulation pattern, and a second sidewall of the portion of the preliminary sacrificial pattern may be exposed, the second sidewall being opposite the first sidewall.

In an embodiment, the method may further include forming a conductive pattern on the substrate prior to forming the preliminary sacrificial pattern, and etching the conductive pattern using the preliminary sacrificial pattern as an etch mask, thereby forming a preliminary bottom electrode pattern.

In an embodiment, the method may further include forming a second insulation pattern covering the second sidewall of the portion of the preliminary sacrificial pattern prior to formation of the preliminary bottom electrode pattern, wherein etching the conductive pattern may include using the second insulation pattern as an etch mask together with the preliminary sacrificial pattern.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
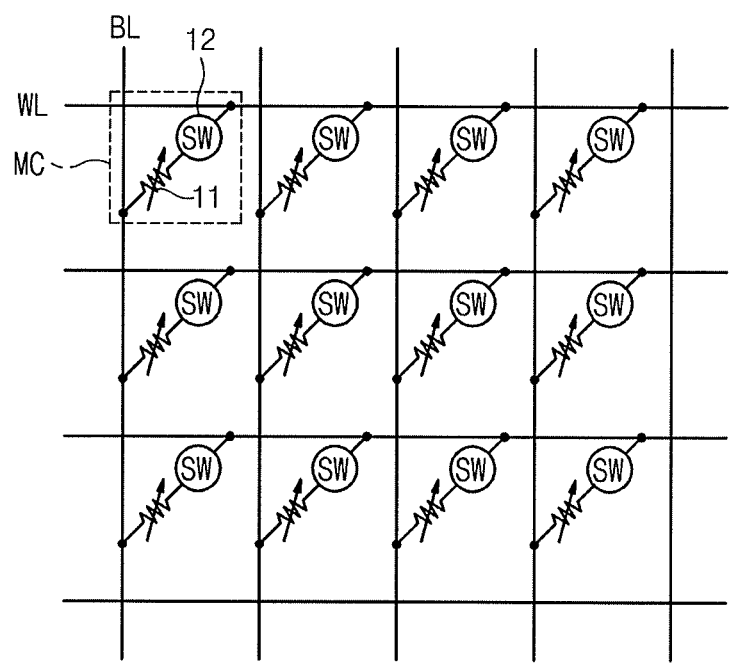
FIG. 1 illustrates an equivalent circuit diagram illustrating a portion of a variable resistive memory device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. The advantages and features of the example embodiments and methods of achieving them will be apparent from the following exemplary embodiments that will be described in more detail with reference to the accompanying drawings. The same reference numerals or the same reference designators denote the same elements throughout the specification.

In the figures, the dimensions of layers and regions may be exaggerated for clarity of illustration. It will be understood that when an element such as a layer, region or substrate is referred to as being "on" another element, it can be directly on the other element or intervening elements may be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. In contrast, the term "directly" means that there are no intervening elements. Similarly, it will be understood that when an element is referred to as being "connected" or "coupled" to another element, it may be directly connected or coupled to the other element or intervening elements may be present. Like reference numerals refer to like elements throughout.

Further, it will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concept.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items.

It will be further understood that the terms "have", "having", "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views and/or plan views as exemplary views of the embodiments. In the drawings, embodiments are not limited to the specific examples provided herein and may be exaggerated for clarity. Accordingly, shapes of the exemplary views may be modified according to manufacturing techniques and/or allowable errors. Therefore, embodiments are not limited to the specific shape illustrated in the exemplary views, and may include other shapes that may be created according to manufacturing processes. For example, etched regions indicated by a right angle may include a rounded shape or a curved shape having a predetermined curvature. Therefore, the specific shapes illustrated in the drawings should not be construed as limiting the scope of the embodiments.

FIG. 1 illustrates a circuit diagram illustrating a portion of a variable resistive memory device according to an exemplary embodiment.

Referring to FIG. 1, a plurality of memory cells MC are arrayed in a matrix form. Each of the memory cells MC may include a variable resistive element 11 and a selection element 12 which may be serially connected to each other. In each of the memory cells MC, one end may be connected to a bit line BL and the other end may be connected to a word line WL. That is, each memory cell MC may intervene between the bit line BL and the word line WL.

A phase of the variable resistive element 11 may be determined according to an amount of current which may be supplied to the variable resistive element 11 through the bit line BL. The selection element 12 may intervene between the variable resistive element 11 and the word line WL. Thus, a voltage applied to the word line WL may control the current supplied to the variable resistive element 11. The selection element 12 may be a diode, a MOS transistor or a bipolar transistor.

In an embodiment, the variable resistive element 11 may include a phase change material. Although embodiments may be described in conjunction with a phase change memory device employing a phase change material, the embodiments are not limited to a phase change memory device. The phase change material may have an amorphous state with a relatively high resistance or a polycrystalline state with a relatively low resistance, e.g. according to a heating temperature and a quenching time thereof. The amorphous state may correspond to a "SET" state, and the polycrystalline state may correspond to a "RESET" state. If a program current is supplied to a bottom electrode contacting the phase change material, the bottom electrode may generate heat, e.g. Joule's heat, to increase a temperature of the phase change material. The heat may be proportional to an electrical resistance of the bottom electrode and a time for which a current, e.g. a constant current, is supplied to the bottom electrode.

FIGS. 2 to 26 illustrate plan views and cross sectional views illustrating methods of forming variable resistive memory devices according to exemplary embodiments.

Figure 2:
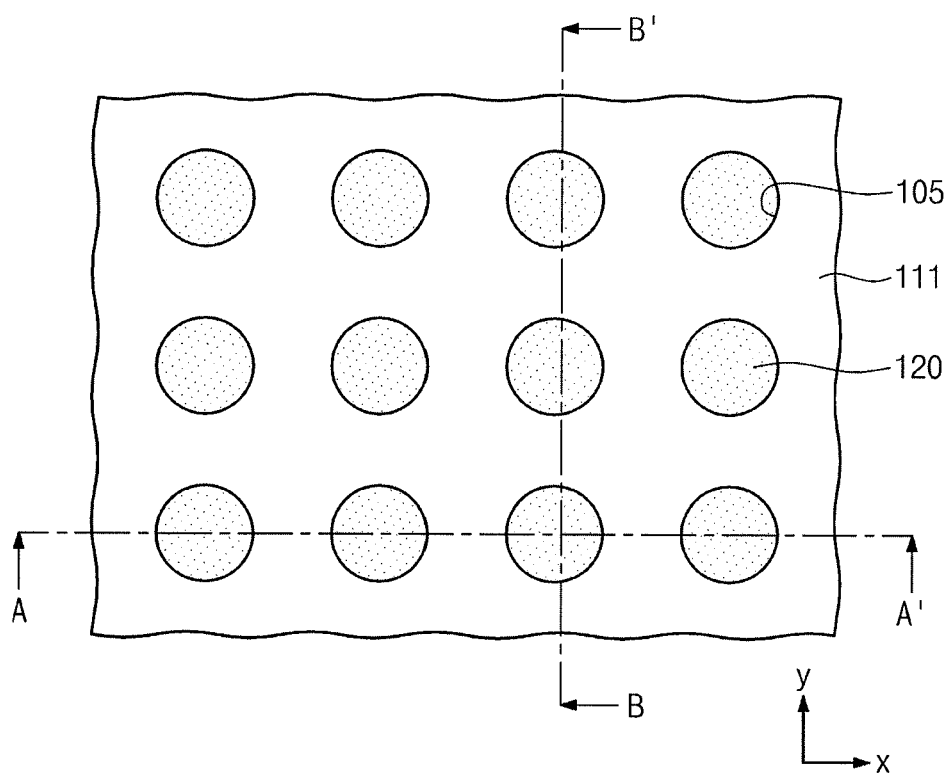
FIGS. 2 to 26 illustrate plan views and cross sectional views of stages in a method of forming variable resistive memory devices according to embodiments.
Figure 3:
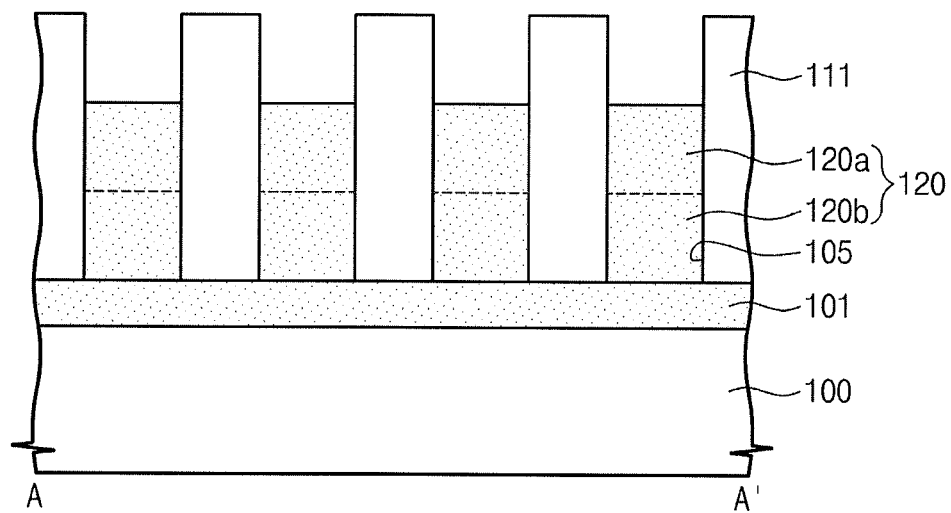
Figure 4:
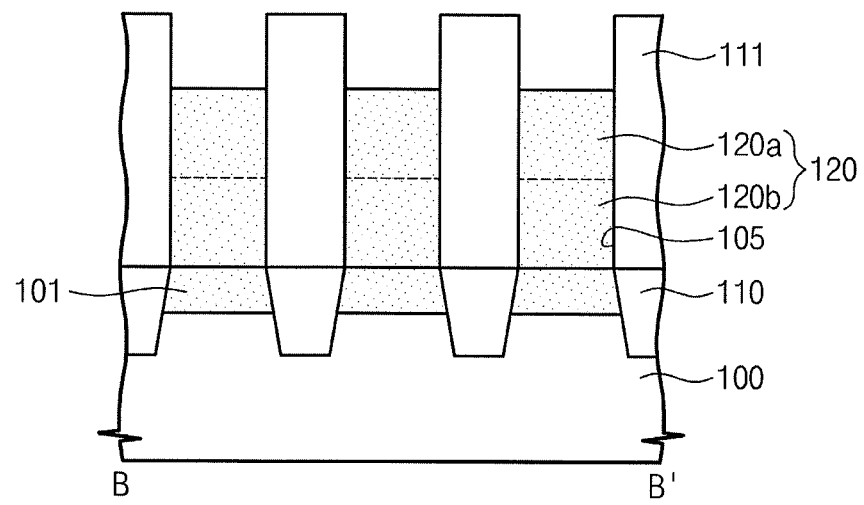

FIG. 2 illustrates a plan view, and FIGS. 3 and 4 illustrate cross sectional views taken along lines A-A' and B-B' of FIG. 2, respectively. Referring to FIGS. 2 through 4, an isolation pattern 110 may be formed in a substrate 100 to define active regions. The substrate 100 may be a semiconductor based substrate, for example, a silicon substrate, a silicon on insulator (SOI) substrate, a silicon-germanium (SiGe) substrate, a germanium (Ge) substrate, or a gallium arsenide (GaAs) substrate. The substrate 100 may be a substrate doped with first conductivity type impurities. For example, the substrate 100 may be a P-type silicon substrate. The isolation pattern 110 may have a line shape extending along an x-axis. The isolation pattern 110 may be formed using a shallow trench isolation (STI) process. The isolation pattern 110 may be formed of an oxide, e.g. silicon oxide layer. The isolation pattern 110 may be formed of a high density plasma (HDP) oxide or a chemical vapor deposition (CVD) oxide having an excellent gap-fill characteristic.

Lower interconnection lines 101 may be formed in the substrate 100. The lower interconnection lines 101 may act as word lines. The lower interconnection lines 101 may be formed by implanting impurity ions into the active regions. In the event that the substrate 100 is a P-type silicon substrate, the lower interconnection lines 101 may be formed by implanting N-type impurity ions into the substrate 100, e.g., the active regions. In this case, the lower interconnection lines 101 may have a line shape extending in the x-axis. The lower interconnection lines 101 may be parallel to the isolation pattern 110.

The lower interconnection lines 101 may also be formed using different processes. For example, the lower interconnection lines 101 may be formed by, e.g. epitaxial growth. The lower interconnection lines 101 may be formed by growing an epitaxial semiconductor layer on the substrate 100 and injecting impurity ions into the epitaxial semiconductor layer. The epitaxial semiconductor layer may include a plurality of parallel epitaxial semiconductor portions. Injection of the impurity ions may be separately or simultaneously performed with formation of the epitaxial semiconductor layer. In another embodiment, the lower interconnection lines 101 may be formed of a metallic layer.

A first interlayer insulation layer 111 may be formed on the substrate having the lower interconnection lines 101. The first interlayer insulation layer 111 may be formed to have openings 105 that expose portions of the substrate 100. The exposed portions of the substrate may be the lower interconnection lines 101 formed in the substrate 100. The first interlayer insulation layer 111 may be formed of an oxide. The openings 105 may be two dimensionally arrayed on the substrate 100. The shape of the openings 105 is not limited, and may be, e.g., a circular shape in a plan view.

Selection elements 120 may be formed in lower portions of the openings 105. Each opening 105 may include a selection element 120. The selection elements 120 may be arrayed in at least two parallel columns, when viewed from a plan view. The columns may be adjacent to each other. The columns may extend along the y-axis. In an embodiment, each of the selection elements 120 may be a diode. Each of the selection elements 120 may include at least two impurity regions 120a and 120b having different conductivities. For example, each of the selection elements 120 may have an N-type semiconductor region and a P-type semiconductor region, which are sequentially stacked. While the drawings may illustrate, as an exemplary embodiment, selection elements 120 that include two impurity regions 120a and 120b, the embodiments set forth herein are not limited to this type of selection element.

In an exemplary embodiment, the selection elements 120 may be formed by epitaxial growth, e.g., by growing an epitaxial layer in the openings 105, etching back the epitaxial layer, and implanting impurity ions into the etched epitaxial layer in each opening 105. Alternatively, the epitaxial layer may be formed using an in-situ doping process. Each of the openings 105 may be partially filled with the selection element 120. That is, a top surface of the selection elements 120 may be located below a top surface of the first interlayer insulation layer 111.

Figure 5:
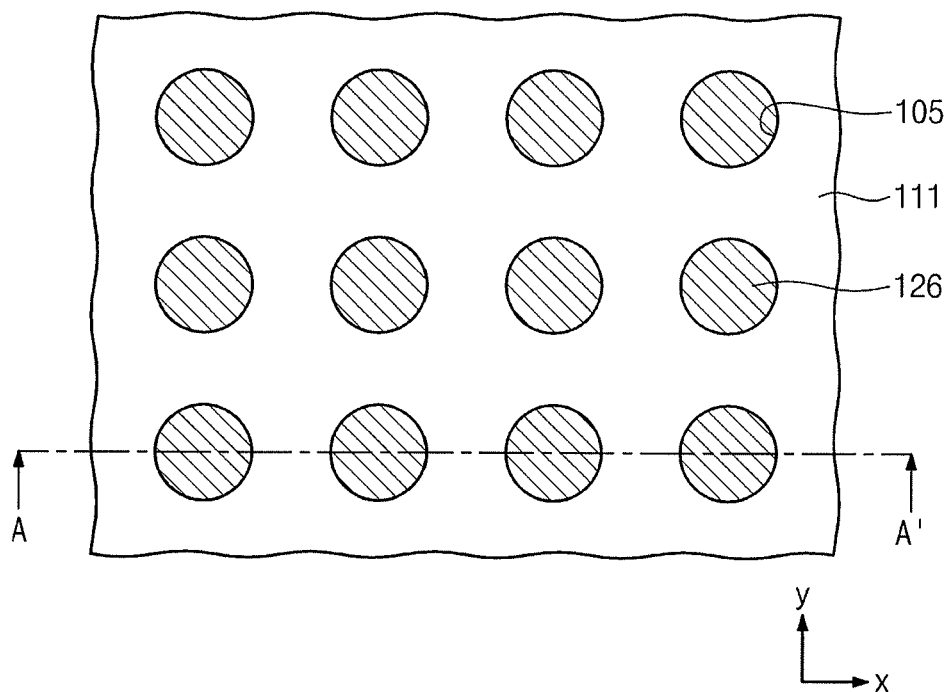
Figure 6:
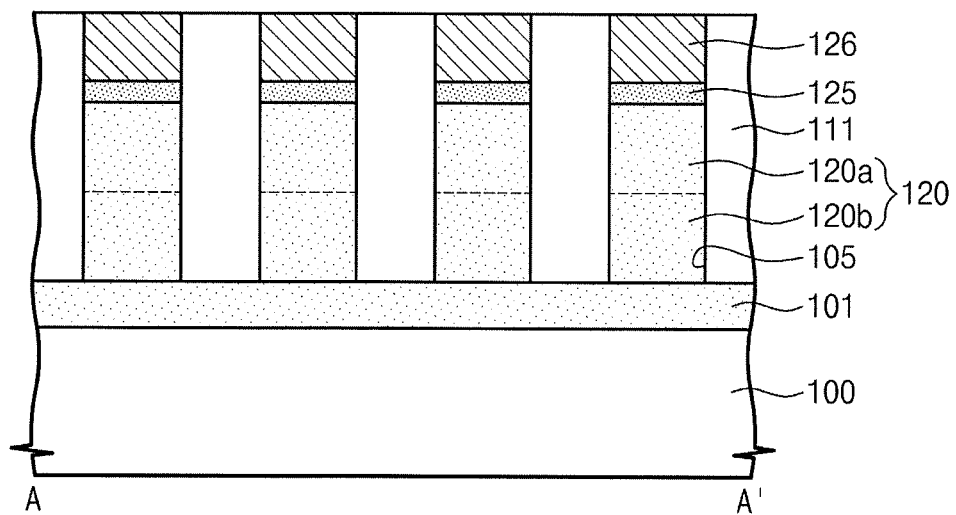

FIG. 5 illustrates a plan view, and FIG. 6 illustrates a cross sectional view taken along a line A-A' of FIG. 5. Referring to FIGS. 5 and 6, first ohmic pattern 125 may be formed on the selection elements 120. In an embodiment, the first ohmic pattern 125 may be formed in the openings 105 on the respective selection elements 120. The first ohmic pattern 125 may reduce contact resistance between the selection elements 120 and second ohmic pattern 126 to be described later. The first ohmic pattern 125 may be formed of a metal silicide, for example, cobalt silicide, nickel silicide, titanium silicide, and combinations thereof. The first ohmic pattern 125 may be formed by forming a metal layer on the selection elements 120 and annealing the metal layer.

Second ohmic pattern 126 may be formed on the first respective ohmic pattern 125. The second ohmic pattern 126 may be formed of a tungsten layer, a titanium nitride layer, a titanium layer, and combinations thereof. The second ohmic pattern 126 may reduce contact resistance between the first ohmic pattern 125 and bottom electrodes BE to be described later. The second ohmic pattern 126 may be formed to fill the respective openings 105. For example, the second ohmic pattern 126 may be formed by forming a metal layer filling the openings 105 and planarizing the metal layer to expose a top surface of the first interlayer insulation layer 111. Alternatively, the process for forming the second ohmic pattern 126 may be omitted.

Figure 7:
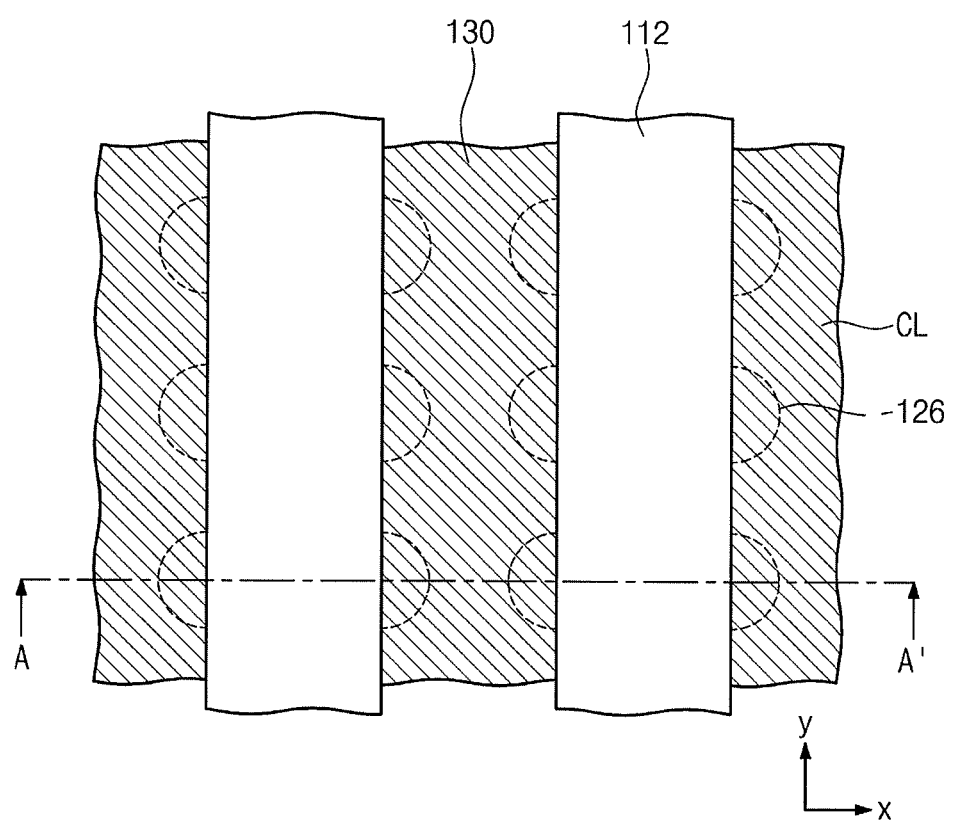
Figure 8:
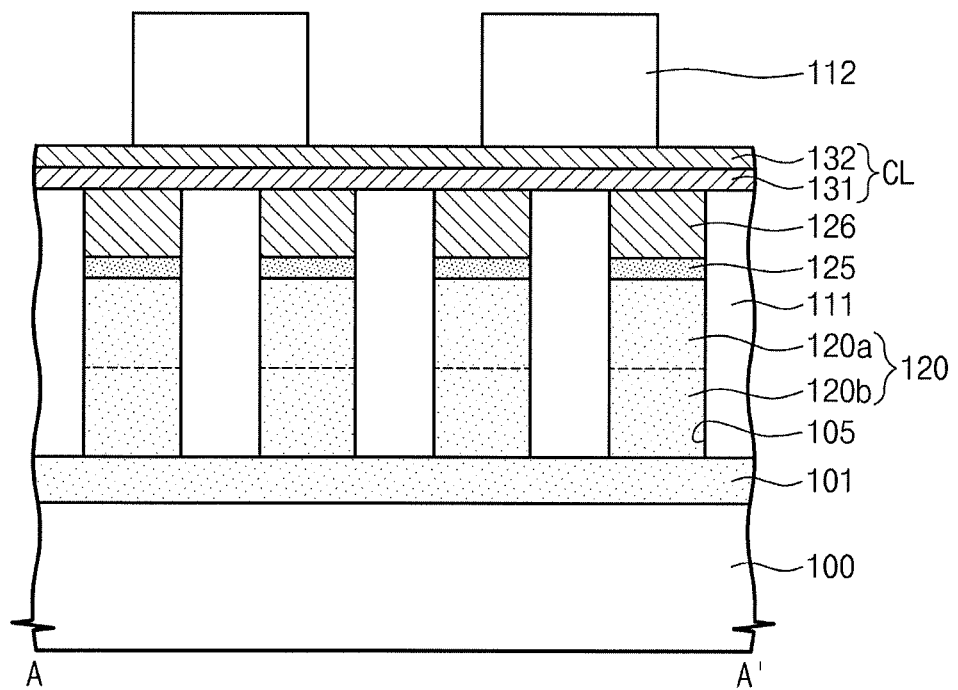

FIG. 7 illustrates a plan view, and FIG. 8 illustrates a cross sectional view taken along a line A-A' of FIG. 7. Referring to FIGS. 7 and 8, a conductive layer CL may be formed on the substrate including the first or second ohmic patterns 125 or 126. The conductive layer CL may be formed to contact the first or second ohmic patterns 125 or 126 and the first interlayer insulation layer 111. The conductive layer CL may be formed of at least one of a metal and a conductive metal nitride. The metal for forming the conductive layer CL may include, e.g., titanium, tantalum, tungsten, and combinations thereof. The metal nitride for forming the conductive layer CL may include, e.g., titanium nitride, tantalum nitride, tungsten nitride, and combinations thereof.

In an embodiment, the conductive layer CL may include a first conductive layer 131 and a second conductive layer 132, which are sequentially stacked. The first conductive layer 131 may have a resistivity which is lower than that of the second conductive layer 132. The first and second conductive layers 131 and 132 may include impurities. The impurity concentration of the first conductive layer 131 may be higher than the impurity concentration of the second conductive layer 132. The impurities in the first and second conductive layers 131 and 132 may include carbon, silicon, oxygen, and combinations thereof. Alternatively, the conductive layer CL may be formed of a single layer. The conductive layer CL may be formed using, e.g., a sputtering process or a chemical vapor deposition (CVD) process.

Third insulation pattern 112 may be formed on the conductive layer CL. The third insulation pattern 112 may be formed to include line-shaped portions that may extend along a y-axis. Each of the line-shaped portions of the third insulation pattern 112 may be formed to at least partially overlap each of two selection elements 120 from two columns, when viewed from a plan view. The columns may be parallel with the y-axis, and each of the line-shaped portions of the third insulation pattern 112 may at least partially overlap at least a portion of each of two selection elements 120 which are adjacent to each other along the x-axis. For example, both sidewalls of each of the line-shaped portions of the third insulation pattern 112 may be parallel with the y-axis, and each sidewall may be provided to overlap at least a portion of each of the selection elements 120 that are arrayed in one of the columns. The third insulation pattern 112 may be formed of silicon oxide, silicon nitride, silicon oxynitride, and combinations thereof.

Figure 9:
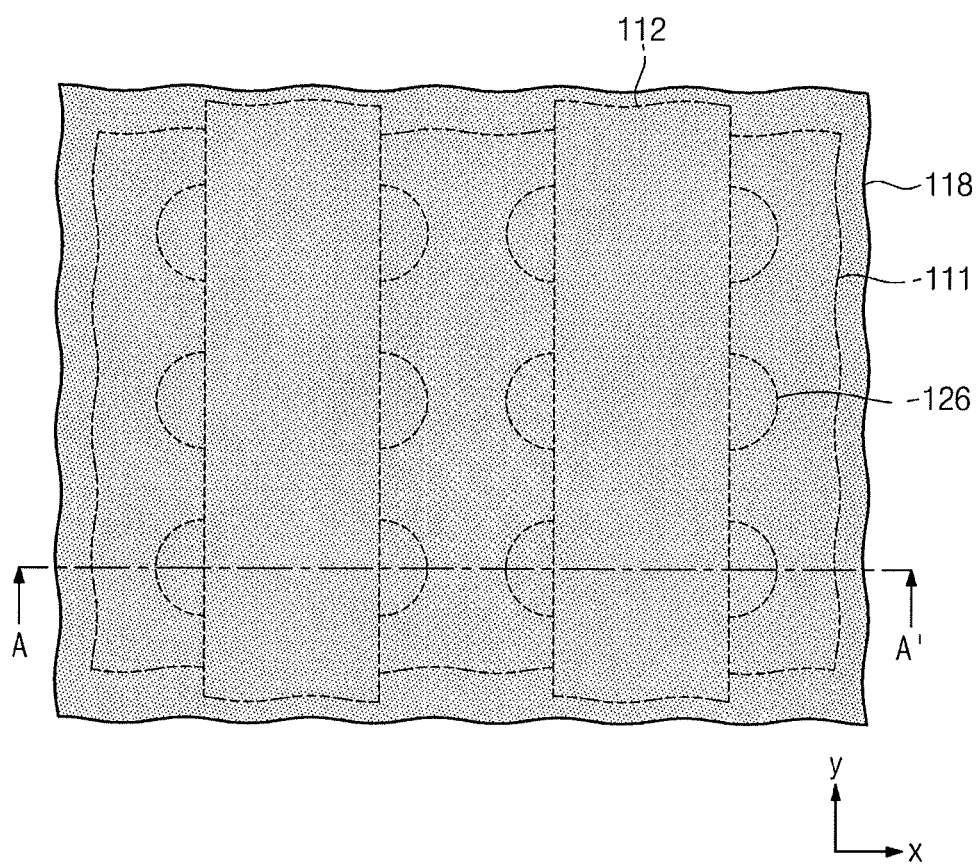
Figure 10:
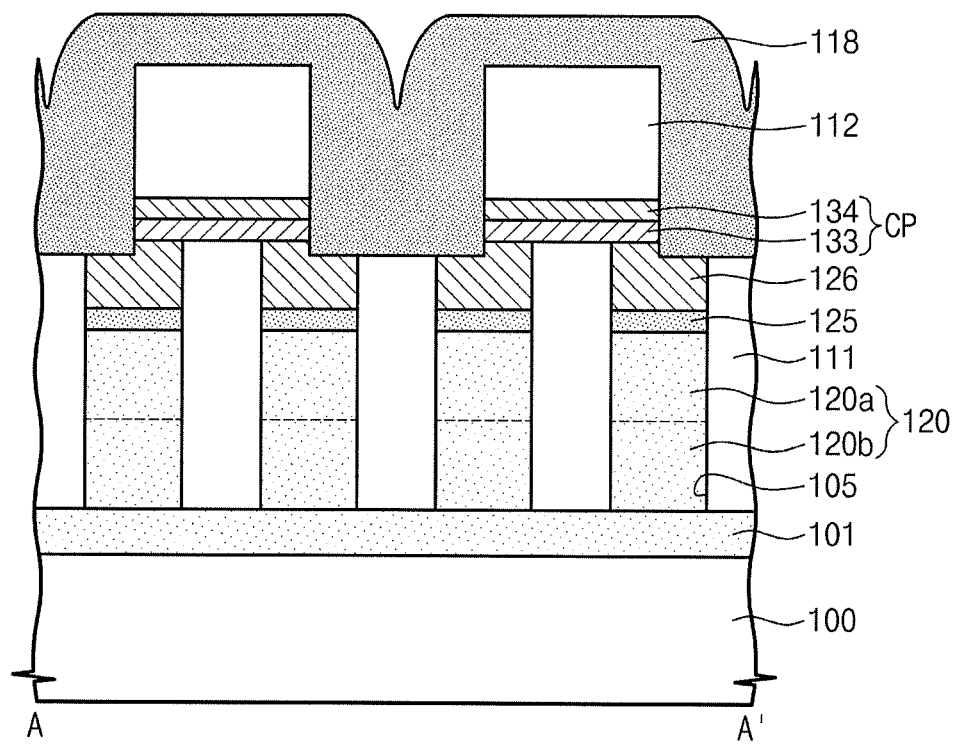

FIG. 9 illustrates a plan view, and FIG. 10 illustrates a cross sectional view taken along a line A-A' of FIG. 9. Referring to FIGS. 9 and 10, the conductive layer CL may be etched using the third insulation pattern 112 as an etch mask, thereby forming a conductive pattern CP under the third insulation pattern 112. The conductive pattern CP may be formed to include line-shaped portions that may extend along a y-axis, and the third insulation pattern 112 may extend along the y-axis. Each of the line-shaped portions of the conductive pattern CP may be formed to at least partially overlap each of two selection elements 120 from two columns, when viewed from a plan view. As a result of etching the conductive layer CL, the first conductive layer 131 may be formed into a first conductive pattern 133, and the second conductive layer 132 may be formed into a second conductive pattern 134. Each of the line-shaped portions of the conductive pattern CP may include a portion of the first conductive pattern 133 and a portion of the second conductive pattern 134, which are sequentially stacked. If the conductive layer CL is over-etched, the first or second ohmic patterns 125 or 126 may be at least partially etched, and the first interlayer insulation layer 111 may be at least partially etched, as illustrated in FIG. 10.

A first insulation layer 118 may be formed on the conductive pattern CP. The first insulation layer 118 may be formed to fill regions between the line-shaped portions of the third insulation pattern 112. The first insulation layer 118 may be formed of a material having an etch selectivity with respect to the third insulation pattern 112. The first insulation layer 118 may be formed of a material exhibiting an etch rate which is less than that of the third insulation pattern 112 when the third insulation patterns 112 is etched using a predetermined etch recipe. In addition, the third insulation pattern 112 may be formed of a material exhibiting an etch rate which is less than that of the first insulation layer 118 when the first insulation layer 118 is etched using another predetermined etch recipe.

The etch selectivity may be expressed as a ratio of etch rates of two different materials exposed to a specific etch recipe. In an embodiment, the third insulation pattern 112 may be formed of a material having an etch selectivity with respect to the first insulation layer 118 within the range of about 1:10 to about 1:200, or about 1:30 to about 1:100. For example, the third insulation pattern 112 may be formed of silicon oxide or silicon nitride, and the first insulation layer 118 may be formed of silicon, silicon oxide, silicon carbide, or silicon nitride. For example, if the third insulation pattern 112 is formed of silicon oxide, the first insulation layer 118 may be formed of silicon, silicon carbide, or silicon nitride. Also by way of example, if the third insulation pattern 112 is formed of silicon nitride, the first insulation layer 118 may be formed of silicon, silicon oxide, or silicon carbide. The third insulation pattern 112 may be described hereinafter in exemplary embodiments as being formed of silicon oxide; however, this particular exemplary embodiment does not limit the scope of the embodiments set forth herein.

Figure 11:
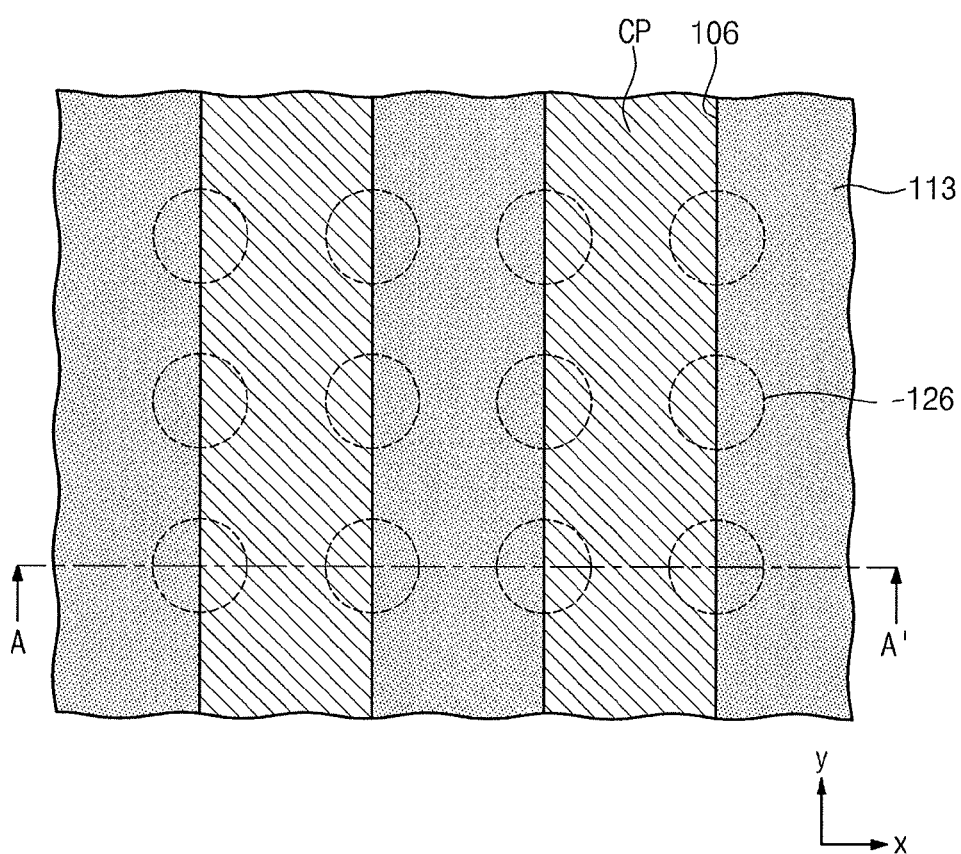
Figure 12:
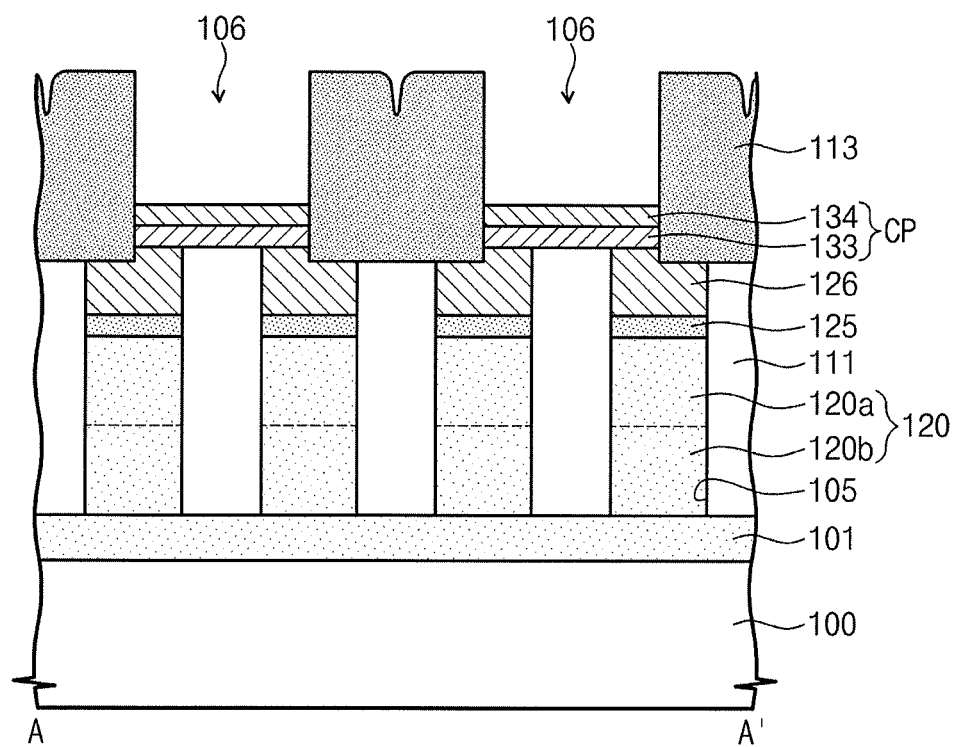

FIG. 11 illustrates a plan view, and FIG. 12 illustrates a cross sectional view taken along a line A-A' of FIG. 11. Referring to FIGS. 11 and 12, the third insulation pattern 112 may be selectively removed. Selectively removing the third insulation pattern 112 may include planarizing the first insulation layer 118 to expose the third insulation pattern 112. The planarization process may form a first insulation pattern 113 from the first insulation layer 118. The first insulation pattern may include a plurality of line-shaped portions which extend along the y-axis. The plurality of line-shaped portions may be separated from each other along the x-axis. The third insulation pattern 112 exposed by the planarization process may be selectively removed to form first trenches 106 that may expose the conductive pattern CP. If the third insulation pattern 112 is formed of silicon oxide, the third insulation pattern 112 may be removed using a hydrofluoric (HF) acid solution.

Each of the first trenches 106 may be defined by a top surface of a line-shaped portion of the conductive pattern CP and sidewalls of line-shaped portions of the first insulation pattern 113 that are adjacent to the line-shaped portion of the conductive pattern CP. Each of the first trenches 106 may extend in the y-axis, and may at least partially overlap each of two selection elements 120 from two columns, when viewed from a plan view.

The first insulation pattern 113 may alternate with the conductive pattern CP along the x-axis. Sidewalls of the first insulation pattern 113 may be in contact with sidewalls of the conductive pattern CP. Top surfaces of the first insulation pattern 113 may be above top surfaces of the conductive patterns CP.

Figure 13:
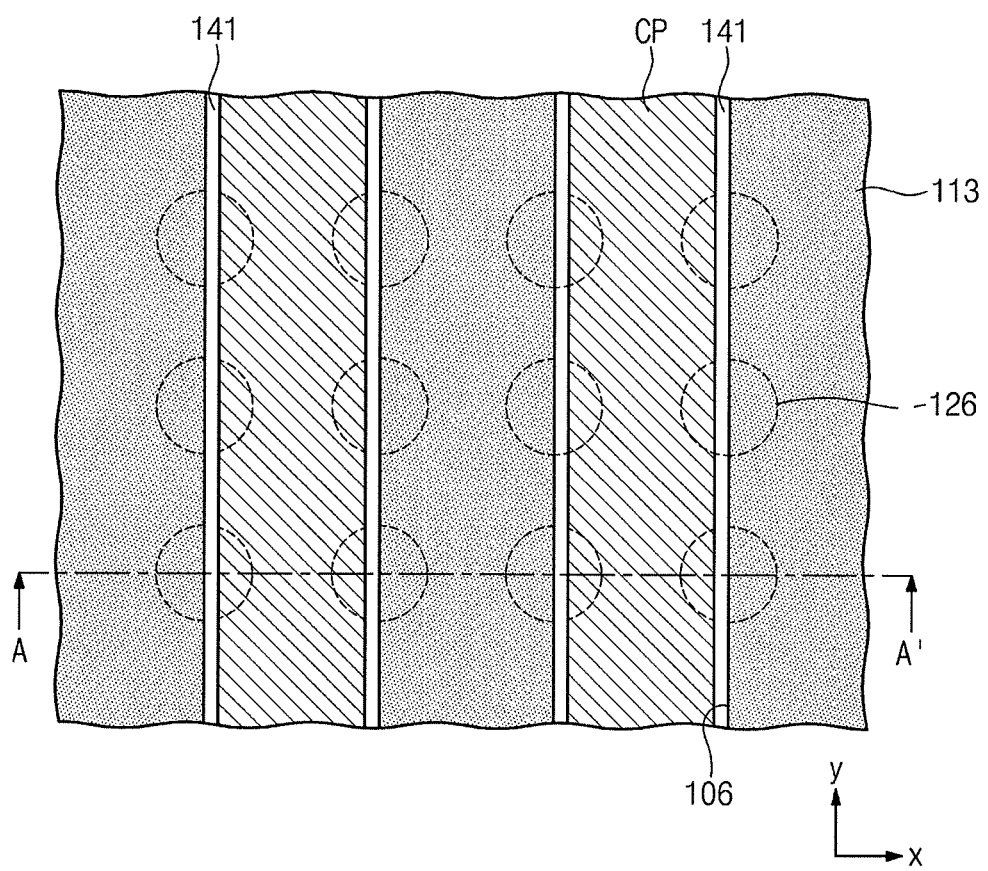
Figure 14:
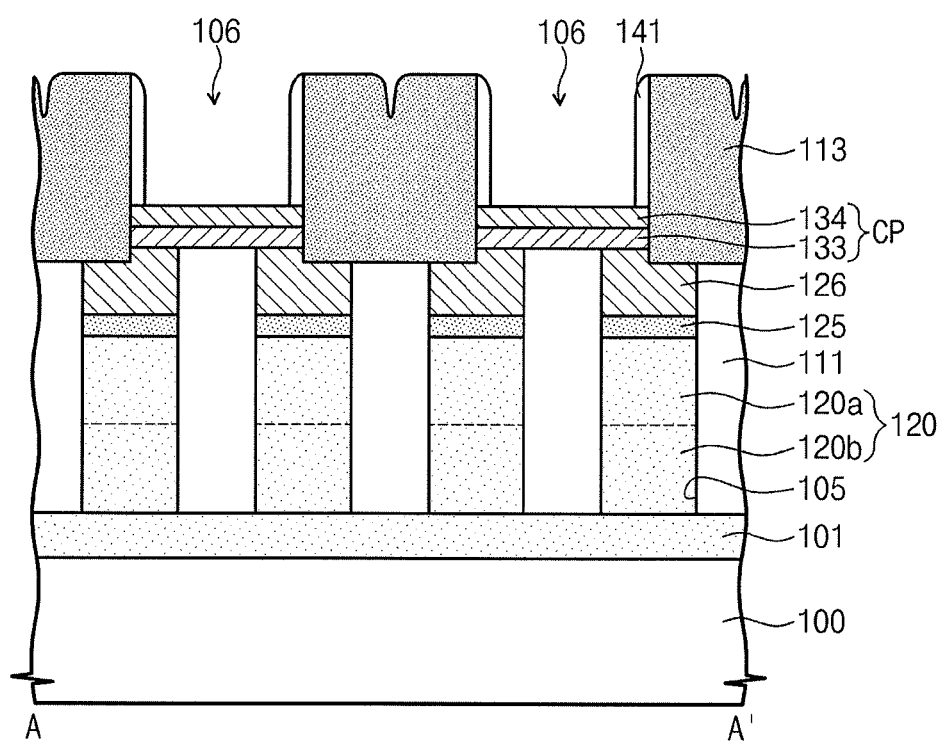

FIG. 13 illustrates a plan view, and FIG. 14 illustrates a cross sectional view taken along a line A-A' of FIG. 13. Referring to FIGS. 13 and 14, a preliminary sacrificial pattern 141 may be formed on sidewalls of the first trenches 106. The preliminary sacrificial pattern 141 may be formed on the conductive pattern CP and may be in contact with both sidewalls of a line-shaped portion of the first insulation pattern 113. A sidewall of the preliminary sacrificial pattern 141 may be vertically aligned with a sidewall of the conductive pattern CP. The preliminary sacrificial pattern 141 may be formed using a spacer formation process. For example, the preliminary sacrificial pattern 141 may be formed by forming an insulation layer on the substrate including the first trenches 106 and anisotropically etching the insulation layer. The preliminary sacrificial pattern 141 may be formed to include line-shaped portions that may extend along a y-axis. The preliminary sacrificial pattern 141 may be formed of a material having an etch selectivity with respect to the first insulation pattern 113. For example, if the first insulation pattern 113 is formed of silicon nitride, the preliminary sacrificial pattern 141 may be formed of silicon oxide. In an embodiment, a width of a line-shaped portion of the preliminary sacrificial pattern 141 along the x-axis direction may be about one tenth to about half of a width of a selection element 120.

Figure 15:
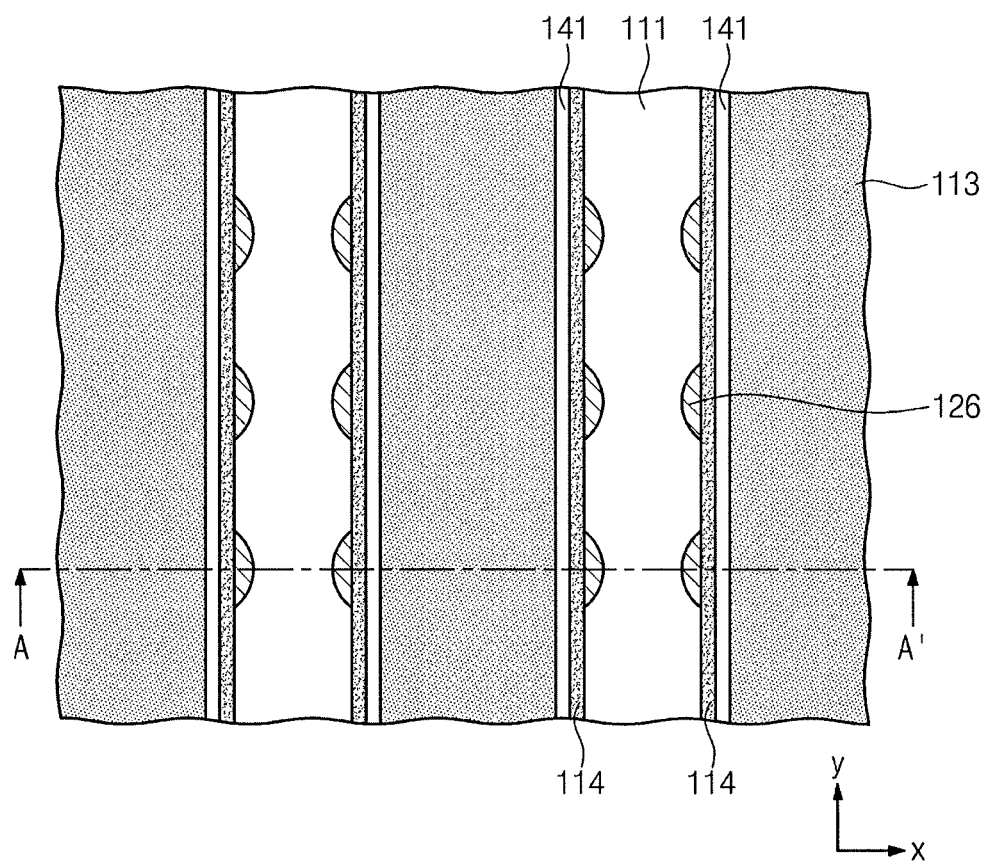
Figure 16:
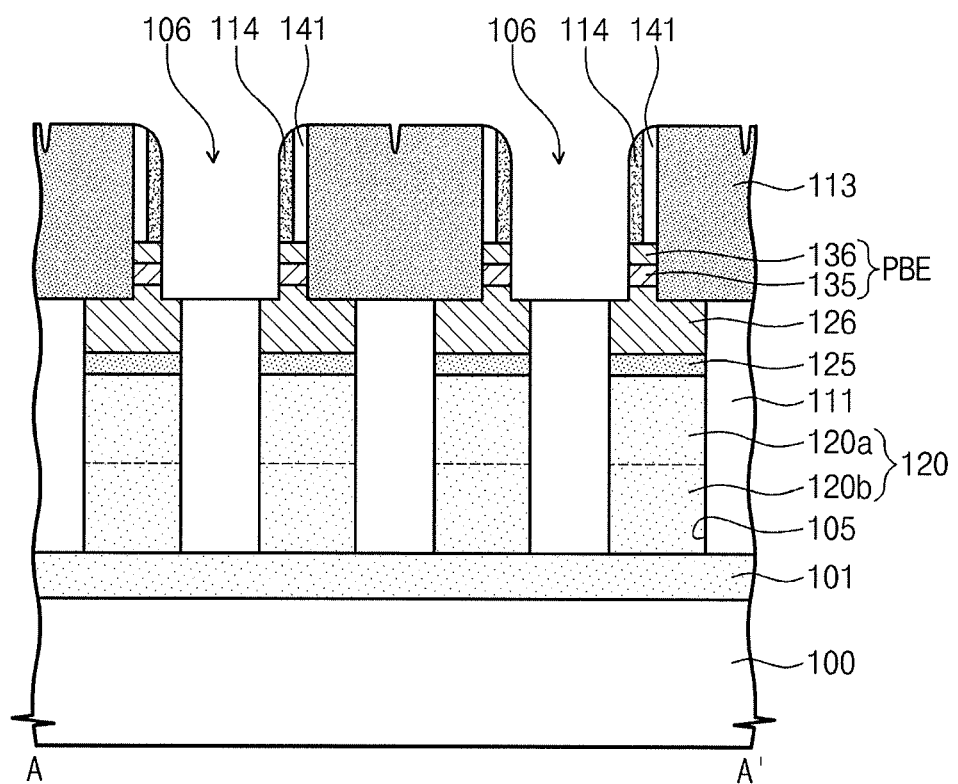

FIG. 15 illustrates a plan view, and FIG. 16 illustrates a cross sectional view taken along a line A-A' of FIG. 15. Referring to FIGS. 15 and 16, a second insulation pattern 114 may be formed on a sidewall of the preliminary sacrificial pattern 141. The second insulation pattern 114 may be formed by forming an insulation layer on the substrate including the preliminary sacrificial pattern 141 and anisotropically etching the insulation layer. If the insulation layer is anisotropically etched, each of the line-shaped portions of the conductive pattern CP may also be etched to split into two line-shaped portions of the preliminary bottom electrode pattern PBE. The preliminary sacrificial pattern 141 and the second insulation pattern 114 may act as etch masks while the preliminary bottom electrode pattern PBE is formed. Thus, a sidewall of the preliminary bottom electrode pattern PBE may be vertically aligned with a sidewall of the second insulation pattern 114. Each of the line-shaped portions of the preliminary bottom electrode pattern PBE may include a portion of a first preliminary bottom electrode pattern 135 and a portion of a second preliminary bottom electrode pattern 136, which are sequentially stacked. The second insulation pattern 114 may be formed to include line-shaped portions that may extend along a y-axis, and the preliminary sacrificial pattern 141 may extend in the y-axis.

After formation of the preliminary bottom electrode pattern PBE, upper portions of the first or second ohmic patterns 125 or 126 may be exposed. While the preliminary bottom electrode pattern PBE is formed, the first or second ohmic patterns 125 or 126 and the first interlayer insulation layer 111 may be at least partially over-etched so that the depth of the first trenches 106 toward the substrate 100 increases. The second insulation pattern 114 may be formed of a material having an etch selectivity with respect to the preliminary sacrificial pattern 141. In an embodiment, if the preliminary sacrificial pattern 141 is formed of silicon oxide, the second insulation patterns 114 may be formed of silicon nitride. In another embodiment, the process for forming the second insulation pattern 114 may be omitted.

Figure 17:
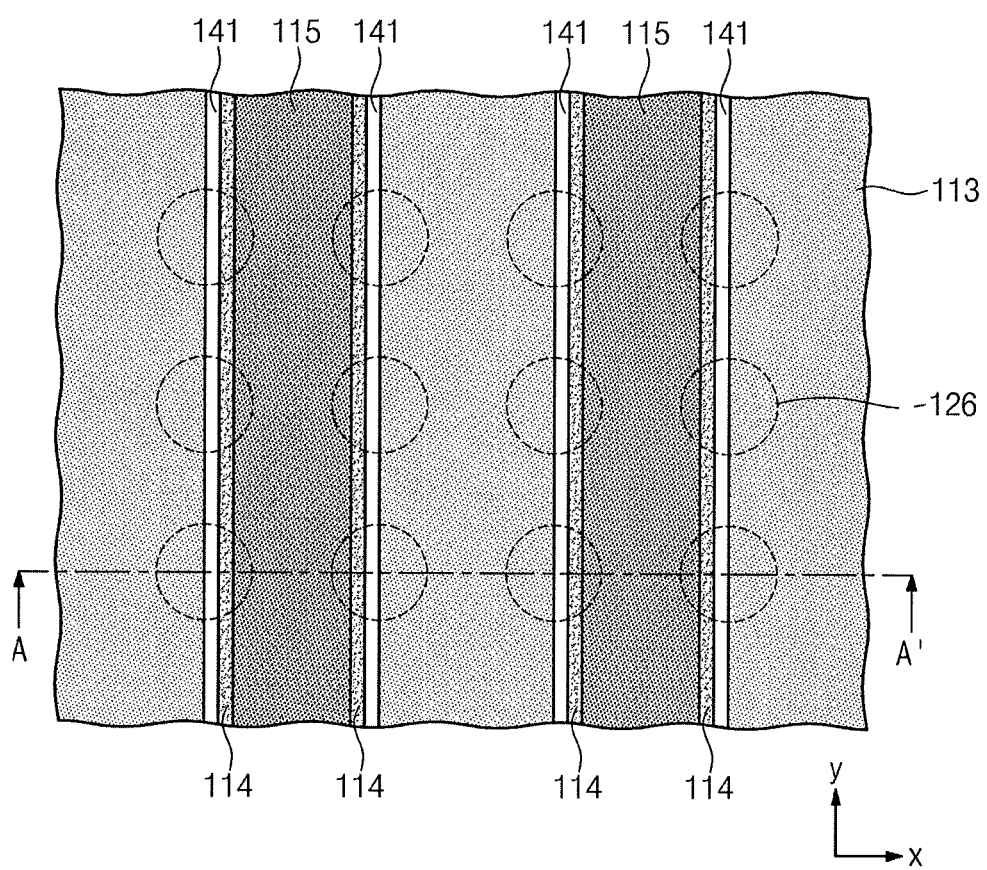
Figure 18:
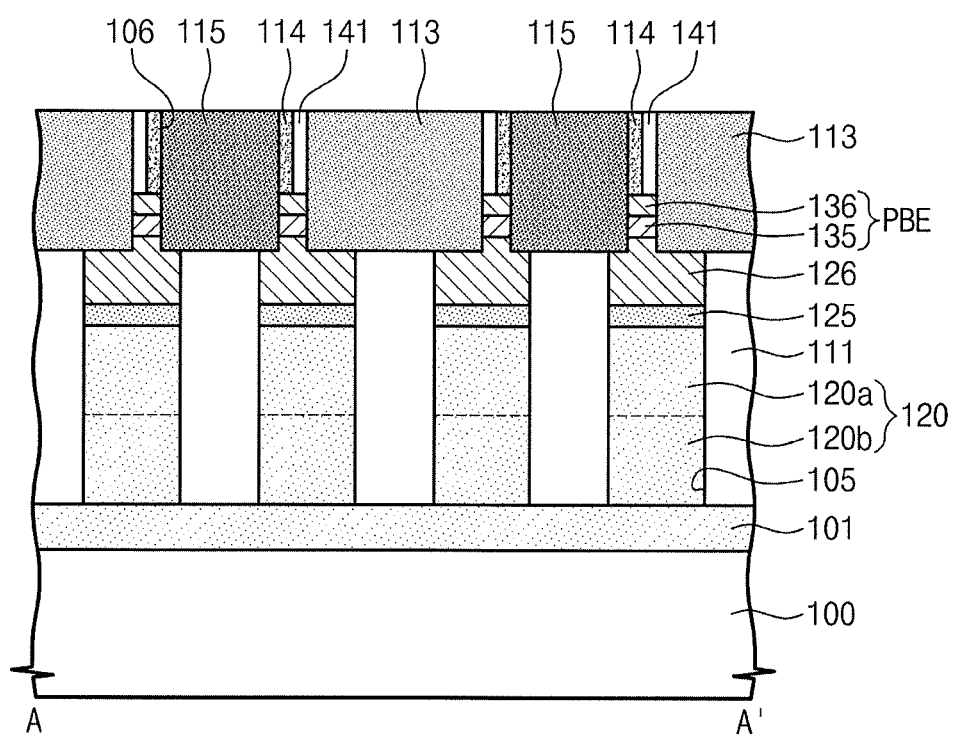

FIG. 17 illustrates a plan view, and FIG. 18 illustrates a cross sectional view taken along a line A-A' of FIG. 17. Referring to FIGS. 17 and 18, a fourth insulation pattern 115 may be formed in the first trenches 106. The fourth insulation pattern 115 may be formed by forming an insulation layer on the substrate to fill the first trenches 106 and planarizing the insulation layer to expose the first insulation pattern 113. The fourth insulation pattern 115 may be formed of a material having an etch selectivity with respect to the preliminary sacrificial patterns 141. For example, if the preliminary sacrificial pattern 141 is formed of silicon oxide, the fourth insulation pattern 115 may be formed of silicon nitride.

Figure 19:
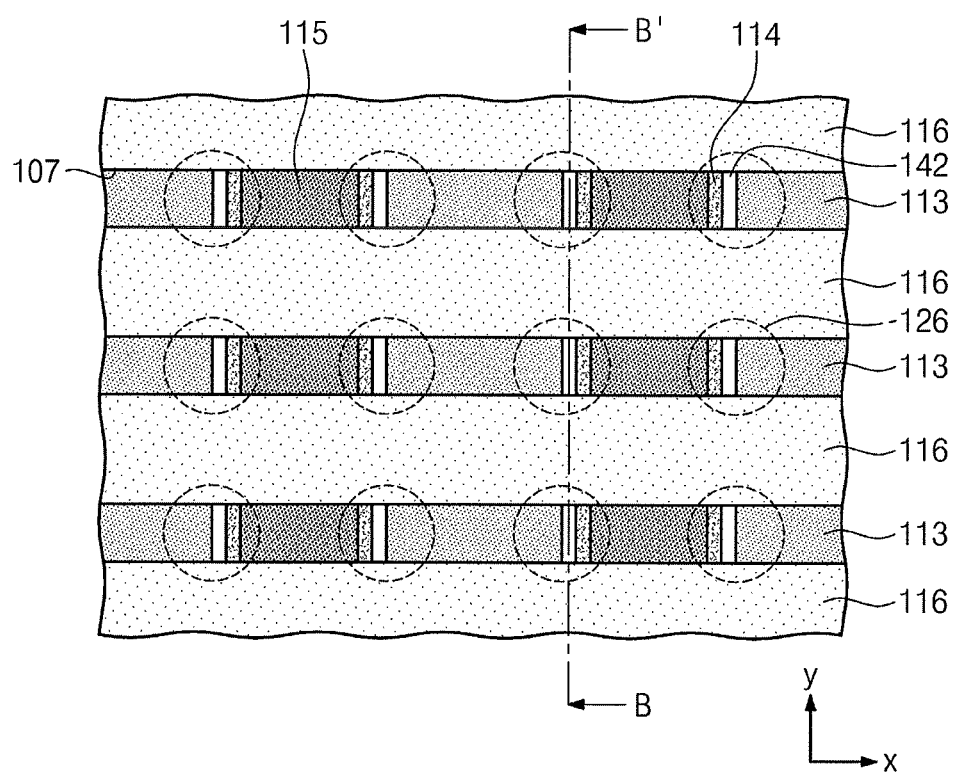
Figure 20:
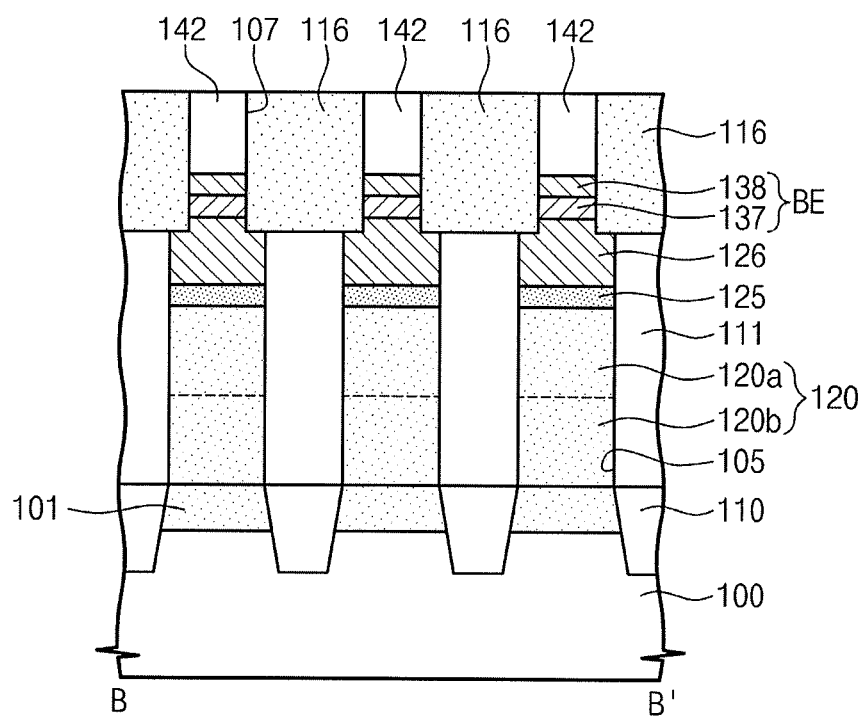

FIG. 19 illustrates a plan view, and FIG. 20 illustrates a cross sectional view taken along a line B-B' of FIG. 19. Referring to FIGS. 19 and 20, the preliminary bottom electrode pattern PBE may be patterned to form a bottom electrode pattern BE, which may include separate portions that are separated from each other along the y-axis direction. Each of the separate portions of the bottom electrode pattern BE may at least partially overlap the respective selection elements 120. Each of the separate portion of the bottom electrode pattern BE may at least partially overlap only one of the selection elements 120. Each of the separate portions of the bottom electrode pattern BE may include a portion of the first bottom electrode pattern 137 and a portion of the second bottom electrode pattern 138, which are sequentially stacked. In an embodiment, the separate portions of the bottom electrode pattern BE may be fabricated by patterning the first insulation pattern 113, the second insulation pattern 114, the fourth insulation pattern 115, the preliminary sacrificial pattern 141, and the preliminary bottom electrode pattern PBE to form a plurality of second trenches 107 extending in the x-axis direction.

The preliminary sacrificial pattern 141 may be patterned to form sacrificial pattern 142 which may include separate portions that are separated from each other along the y-axis direction. The separate portions of the sacrificial pattern 142 may be formed while the second trenches 107 are formed. Each of the separate portions of the sacrificial pattern 142 may at least partially overlap the respective selection elements 120. Each of the separate portion of the sacrificial pattern 142 may at least partially overlap only one of the selection elements 120. The first 125 or second 126 ohmic pattern and the first interlayer insulation layer 111 may be at least partially etched while the second trenches 107 are formed.

A fifth insulation pattern 116 may be formed in the second trenches 107. The fifth insulation pattern 116 may be formed of a material having an etch selectivity with respect to the sacrificial pattern 142. For example, if the sacrificial pattern 142 is formed of silicon oxide, the fifth insulation pattern 116 may be formed of silicon nitride. The fifth insulation pattern 116 may be formed by forming an insulation layer on the substrate including the second trenches 107 and planarizing the insulation layer to expose the sacrificial pattern 142.

Figure 21:
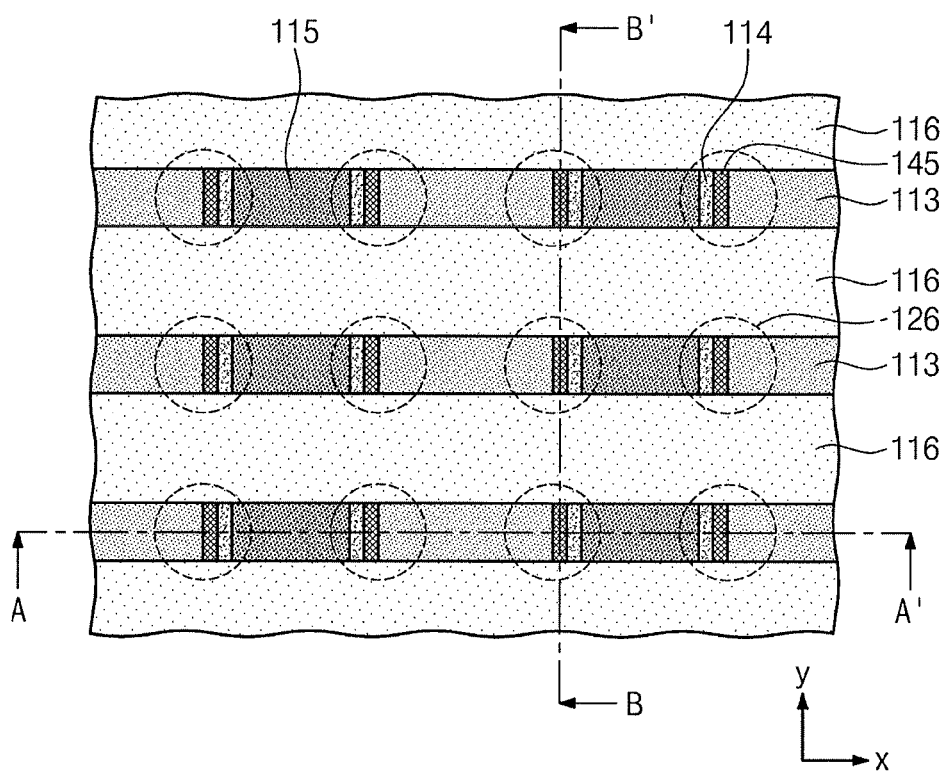
Figure 22:
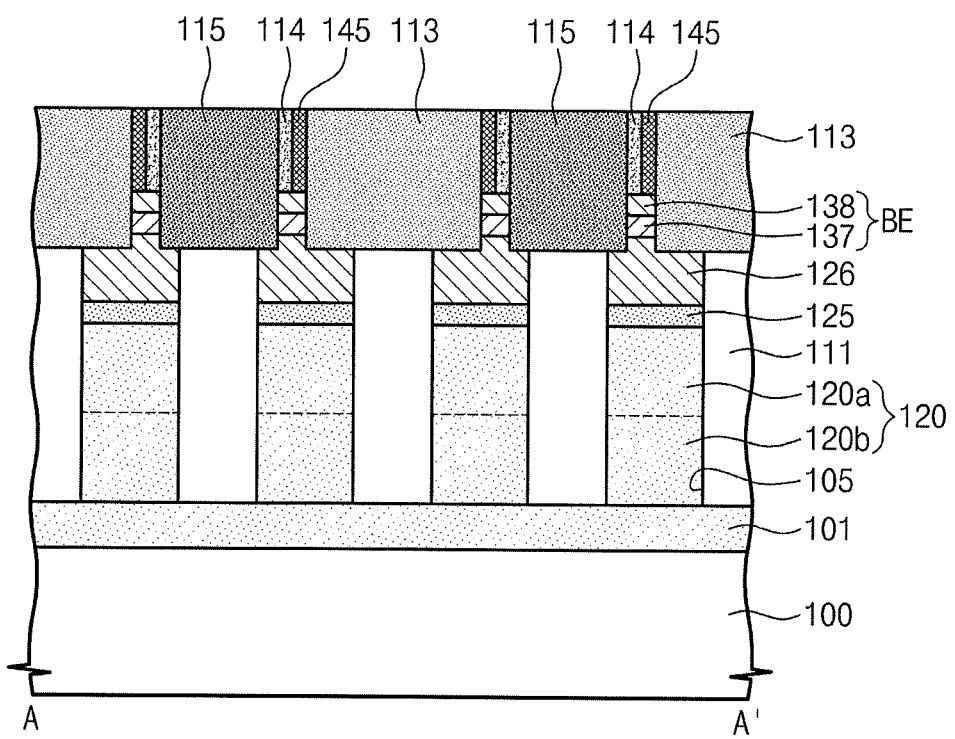
Figure 23:
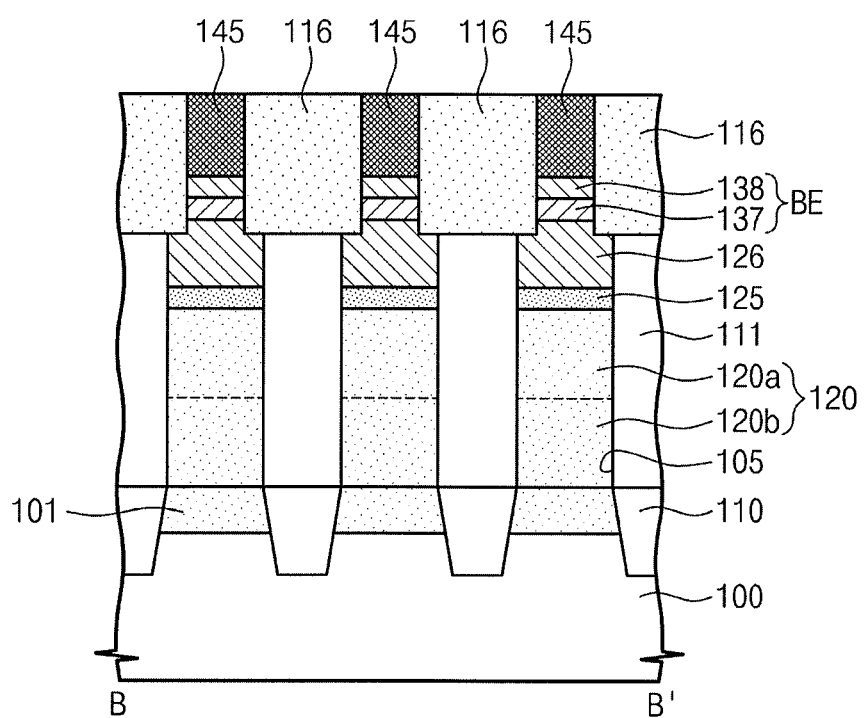

FIG. 21 illustrates a plan view, and FIGS. 22 and 23 illustrate cross sectional views taken along lines A-A' and B-B' of FIG. 21, respectively. Referring to FIGS. 21, 22 and 23, the sacrificial pattern 142 may be replaced with a variable resistive pattern 145. Replacing the sacrificial pattern 142 may include selectively removing the sacrificial pattern 142. As described above, the sacrificial patterns 142 may be formed of a material having an etch selectivity with respect to the first, second, fourth and fifth insulation patterns 113, 114, 115 and 116. If the sacrificial pattern 142 is formed of silicon oxide and the insulation patterns 113, 114, 115 and 116 are formed of silicon nitride, the sacrificial pattern 142 may be selectively removed using an etchant, e.g., an etchant including a hydrofluoric (HF) acid solution.

The variable resistive pattern 145 may be formed to fill spaces where the sacrificial pattern 142 is removed. In an embodiment, the variable resistive pattern 145 may be formed by forming a variable resistive layer filling the spaces where the sacrificial pattern 142 is removed and planarizing the variable resistive layer to expose the insulation patterns 113, 114, 115 and 116. The planarization of the variable resistive layer may form the variably resistive pattern 145, which may include a plurality of separate portions that are disposed over the respective selection elements 120. Each of the separate portions of the variable resistive pattern 145 formed by the replacement process may be vertically self-aligned with at least one sidewall of the respective separate portions of the bottom electrode pattern BE.

In an embodiment, the variable resistive pattern 145 may be formed of a phase change material. The phase change material may be a reversible material. The phase change material may be formed of a material including at least one chalcogenide element, e.g., tellurium (Te) and selenium (Se). The phase change material may also include, e.g., at least one of germanium (Ge), antimony (Sb), bismuth (Bi), lead (Pb), tin (Sn), silver (Ag), arsenic (As), sulfur (S), silicon (Si), phosphorus (P), oxygen (O) and carbon (C). The phase change material may be a compound material. The variable resistive pattern 145 may be formed using a damascene process. The variable resistive pattern 145 may be formed without use of an etch process for patterning the variable resistive layer. Without use of an etch process, the variable resistive pattern 145 can be prevented from being damaged.

Figure 24:
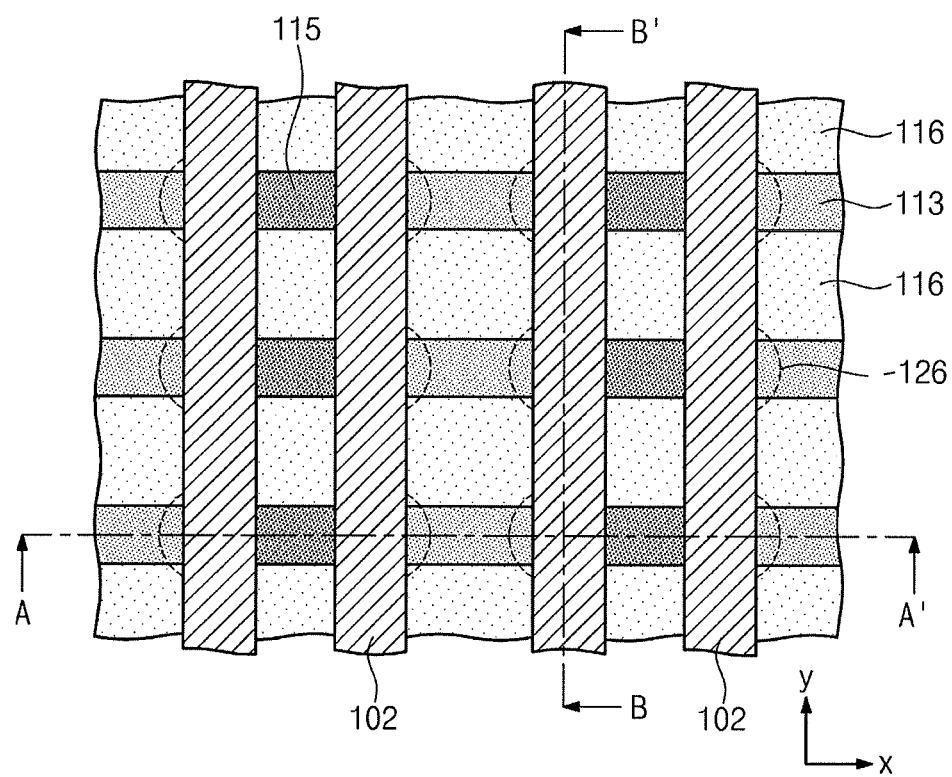
Figure 25:
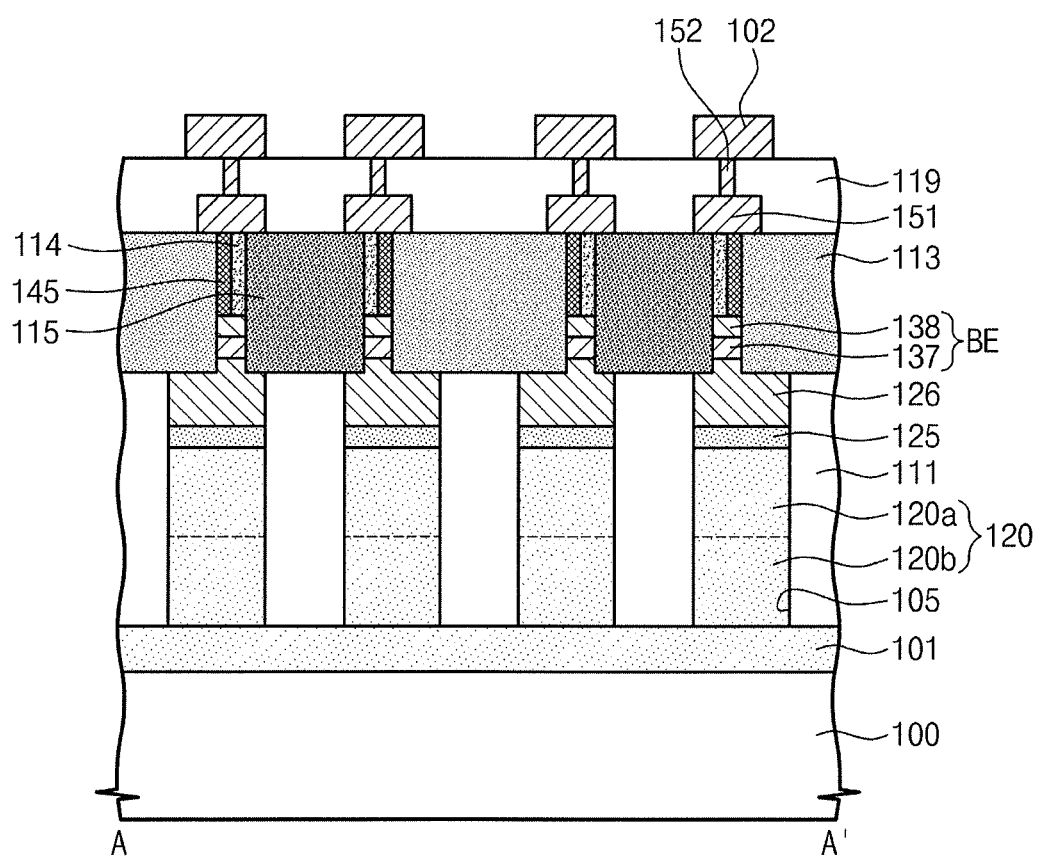
Figure 26:
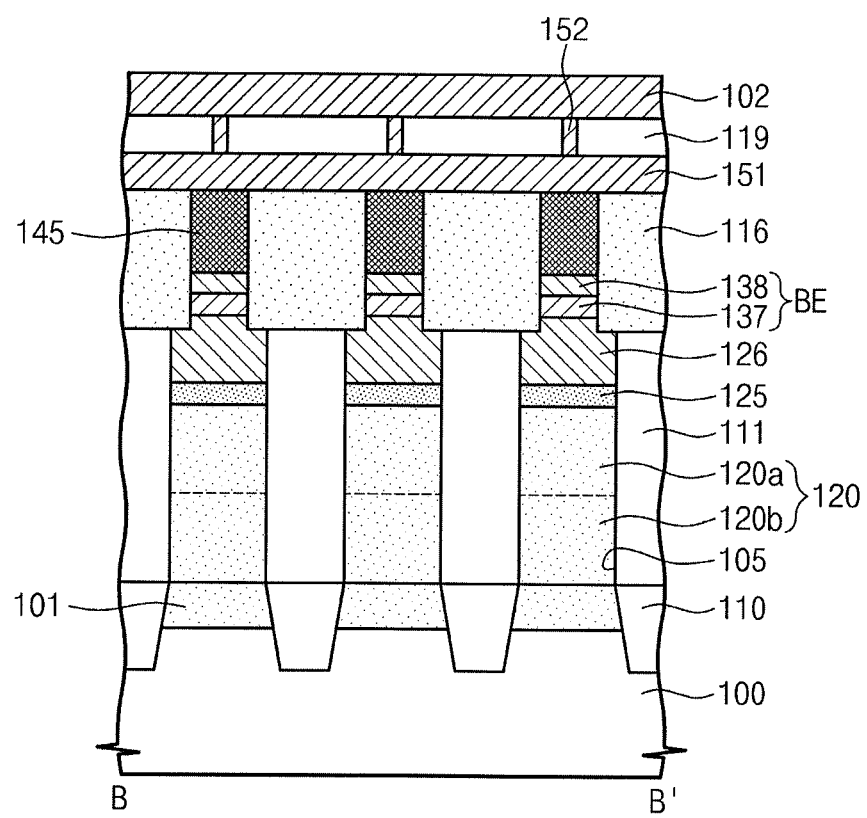

FIG. 24 illustrates a plan view, and FIGS. 25 and 26 illustrate cross sectional views taken along lines A-A' and B-B' of FIG. 24, respectively. Referring to FIGS. 24, 25 and 26, top electrode pattern 151 and upper interconnection lines 102 may be formed on the variable resistive pattern 145. The top electrode pattern 151 may contact top surfaces of the variable resistive pattern 145. Alternatively, a barrier layer (not shown) may be formed between the top electrode pattern 151 and the variable resistive pattern 145. The barrier layer may prevent atomic inter-diffusion between the variable resistive pattern 145 and the top electrode pattern 151. The barrier layer may be formed of at least one of a metal nitride, a conductive carbon, and a metal. For example, the barrier layer may be formed of at least one of titanium nitride (TiN), tungsten nitride (WN), and tantalum nitride (TaN). The top electrode pattern 151 may be formed to have a line shape that may extend along the y-axis, and may be electrically connected to the variable resistive pattern 145, which may be arrayed over the columns of selection elements 120 that may extend along the y-axis. Each of the upper interconnection lines 102 may be electrically connected to the top electrode pattern 151 through a plurality of contact plugs 152 that are formed in a second interlayer insulation layer 119. The second interlayer insulation layer 119 is not shown in FIG. 24 in order to illustrate the underlying layers. The contact plugs 152 may be formed to at least partially overlap the bottom electrode pattern BE. Each of the contact plugs 152 may only overlap one of the separate portions of the bottom electrode pattern BE. The upper interconnection lines 102 may extend in a direction parallel with the y-axis. The top electrode pattern 151 and the upper interconnection lines 102 may each independently be formed of a metal, a conductive metal nitride, a doped silicon, and combinations thereof. The second interlayer insulation layer 119 may be formed of silicon oxide or silicon oxynitride.

According to an embodiment, the sacrificial pattern 142 may be formed of silicon oxide and the insulation patterns 113, 114, 115 and 116 may be formed of silicon nitride. However, the materials of the sacrificial pattern 142 and the insulation patterns 113, 114, 115 and 116 are not limited to the above embodiment. Any materials having an etch selectivity with respect to the insulation patterns 113, 114, 115 and 116 can be employed as the sacrificial pattern 142. For example, if the insulation patterns 113, 114, 115 and 116 are formed of silicon oxide, the sacrificial pattern 142 may be formed of silicon, silicon carbide, or silicon nitride. Alternatively, if the insulation patterns 113, 114, 115 and 116 are formed of silicon nitride, the sacrificial pattern 142 may be formed of silicon, silicon carbide, or silicon oxide.

Now, a structure of a variable resistive memory device according to an example embodiment will be described in detail with reference to the embodiment illustrated in FIGS. 24, 25 and 26.

Referring again to FIGS. 24, 25 and 26, a first interlayer insulation layer 111 including openings 105 may be provided on a substrate 100. An isolation pattern 110 defining active regions may be disposed in the substrate 100, and lower interconnection lines 101 may be disposed in the respective active regions. Thus, the lower interconnection lines 101 may be parallel with the isolation pattern 110. Selection elements 120 may be disposed in lower regions of the respective openings 105, and a second ohmic pattern 126 may be disposed in an upper portion of the respective openings 105. A first ohmic pattern 125 may be provided between the selection elements 120 and the second ohmic pattern 126.

A bottom electrode pattern BE may be disposed on the second ohmic pattern 126. An upper sidewall of the second ohmic pattern 126 may be vertically aligned with a sidewall of the bottom electrode pattern BE. Each of the separate portions of the bottom electrode pattern BE may include a portion of a first bottom electrode pattern 137 and a portion of a second bottom electrode pattern 138. The first bottom electrode pattern 137 may have a resistivity different from that of the second bottom electrode pattern 138. For example, the resistivity of the first bottom electrode pattern 137 may be less than that of the second bottom electrode pattern 138. In this case, the first bottom electrode pattern 137 may reduce a total electrical resistance of the bottom electrode pattern BE, and the second bottom electrode pattern 138 may increase a contact resistance between the bottom electrode pattern BE and a variable resistive pattern 145 to be described hereinafter. Thereby, the variable resistive pattern 145 can be efficiently heated.

A variable resistive pattern 145 may be disposed on the bottom electrode pattern BE. In an embodiment, the variable resistive pattern 145 includes separate portions, and each of the separate portions of the variable resistive pattern 145 may at least partially cover a top surface of respective separate portions of the bottom electrode pattern BE. A surface area of a bottom of each of the separate portions of the variable resistive pattern 145 may be less than a surface area of a top of each of respective separate portions of the bottom electrode pattern BE. At least a portion of a sidewall of the variable resistive pattern 145 may be vertically aligned with a portion of a sidewall of the bottom electrode pattern BE. A width of a separate portion of the variable resistive pattern 145 in an x-axis direction may be less than a width of a respective separate portion of bottom electrode pattern BE in the x-axis direction. A width of a separate portion of the variable resistive pattern 145 in a y-axis direction may be substantially equal to a width of a respective separate portion of the bottom electrode pattern BE in the y-axis direction. A height of a separate portion of the variable resistive pattern 145 may be greater than a width of the separate portion of the variable resistive pattern 145 in the x-axis direction, and may be greater than a width of the separate portion of the variable resistive pattern 145 in the y-axis direction. The shape of the variable resistive pattern 145 is not limited, and it may have a rectangular shape, an arc shape, or a semicircle shape, in a plan view. Each separate portion of the variable resistive pattern 145 may be surrounded by the first, second, fourth, and fifth insulation patterns 113, 114, 115 and 116.

Portions of the first or fourth insulation patterns 113 or 115 may be disposed between adjacent separate portions of the variable resistive pattern 145 along the x-axis direction. Adjacent separate portions of the variable resistive pattern 145 may also be adjacent to both sides of the respective portions of the first or fourth insulation patterns 113 or 115. Separate portions of the variable resistive pattern 145 adjacent to both sides of a portion of the first or fourth insulation patterns 113 or 115 may have a symmetrical structure relative to the portion of the first or fourth insulation patterns 113 or 115. Similarly, portions of first or second ohmic patterns 125 or 126 adjacent to both sides of a portion of the first or fourth insulation pattern 113 or 115 may have a symmetrical structure relative to the portion of the first or fourth insulation pattern 113 or 115.

The insulation patterns 113, 114, 115 and 116 may be formed of the same material. For example, the insulation patterns 113, 114, 115 and 116 may be formed of silicon nitride. A top electrode pattern 151 may be disposed on the variable resistive pattern 145. The top electrode pattern 151 may be electrically connected to upper interconnection lines 102 through contact plugs 152 formed in a second interlayer insulation layer 119.

Figure 27:
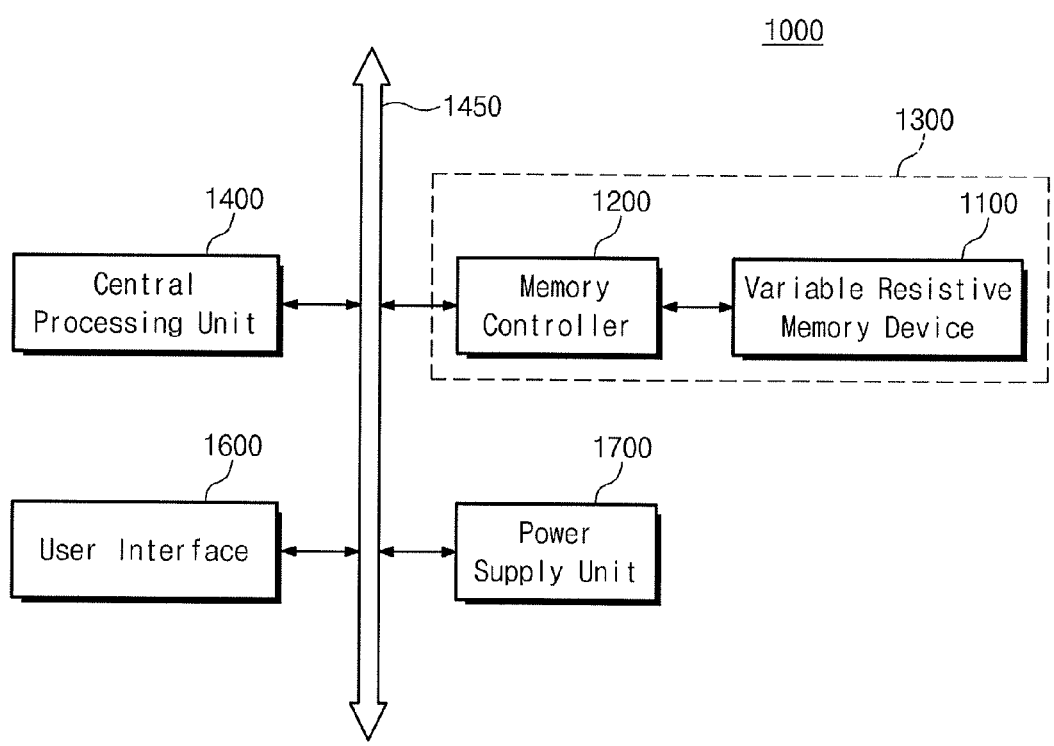
FIG. 27 illustrates a block diagram illustrating an information processing system including a variable resistive memory device fabricated according to an embodiment.

FIG. 27 illustrates a block diagram illustrating an information processing system including a variable resistive memory device fabricated according to an embodiment.

Referring to FIG. 27, an information processing system 1000 according to an embodiment may include a semiconductor memory system 1300, a central processing unit (CPU) 1400, a user interface unit 1600 and a power supply unit 1700 that communicate with each other through a system bus 1450. The semiconductor memory system 1300 may include a variable resistive memory device 1100 and a memory controller 1200. The variable resistive memory device 1100 may store data processed by the CPU 1400 or data provided by the user interface unit 1600 through the memory controller 1200. The variable resistive memory device 1100 may be applied to a solid state disk (SSD). In this case, the operation speed of the information processing system 1000 may be significantly improved.

Although not shown in the drawings, it will be apparent to those skilled in the art that the information processing system 1000 may further include an application chipset, a camera image processor or a mobile DRAM.

Further, the information processing system 1000 may be applied to any device, including, e.g., personal digital assistant (PDA), a portable computer, a web tablet, a wireless phone, a mobile phone, a digital music player, a memory card, or any electronic device which is capable of receiving or transmitting information data by wireless signal.

The variable resistive memory device 1100 may be encapsulated using various packaging techniques. For example, the variable resistive memory device 1100 according to any of the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

By way of summation and review, phase change memory devices may have increased integration density with low power consumption. In the phase change memory devices, a contact area between a bottom electrode and a variable resistive material pattern may influence program characteristics of memory cells. Thus, it may be desirable to improve uniformity of the contact areas between the bottom electrodes and the variable resistive material patterns of memory cells. It may also be desirable to minimize the contact areas between the bottom electrodes and the variable resistive material patterns. If the variable resistive material patterns are self-aligned with the bottom electrodes, the uniformity of the contact areas between the bottom electrodes and the variable resistive material patterns may be improved.

According to the exemplary embodiments set forth above, a conductive pattern may be patterned using a sacrificial pattern as an etch mask to form a bottom electrode pattern, and the sacrificial pattern may be replaced with a variable resistive pattern. The variable resistive pattern may be self-aligned with the bottom electrode pattern. Consequently, the processes for forming the bottom electrode pattern and the variable resistive pattern can be simplified, and possible misalignment between the bottom electrode pattern and the variable resistive pattern can be prevented.

The exemplary embodiments may provide methods of forming the variable resistive memory devices including self-alignment of a variable resistive pattern with respect to a bottom electrode. The exemplary embodiments may be applied to, for example, phase change memory devices. According to the exemplary embodiments, the contact areas between the variable resistive material patterns and the bottom electrodes may be significantly reduced to increase an electrical contact resistance between the variable resistive material patterns and the bottom electrodes. Also, the variable resistive material patterns may be self-aligned with the bottom electrodes. Thus, the program efficiency of the memory cells may be remarkably enhanced.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A method of forming a variable resistive memory device, the method comprising:

forming a conductive pattern and a first insulation pattern on a substrate, such that the conductive pattern alternates with the first insulation pattern along a first direction on a substrate, the first direction being parallel with a surface of the substrate;

forming a preliminary sacrificial pattern on the conductive pattern, such that the preliminary sacrificial pattern contacts a sidewall of the first insulation pattern;

etching the conductive pattern using the preliminary sacrificial pattern as an etch mask, thereby forming a preliminary bottom electrode pattern;

patterning the preliminary sacrificial pattern and the preliminary bottom electrode pattern to form a sacrificial pattern and a bottom electrode pattern, such that at least two portions of the sacrificial pattern are separated from each other along a second direction intersecting the first direction, and at least two portions of the bottom electrode pattern are separated from each other along the second direction; and replacing the sacrificial pattern with a variable resistive pattern.

2. The method as claimed in claim 1, further comprising forming a second insulation pattern covering a sidewall of the preliminary sacrificial pattern prior to formation of the preliminary bottom electrode pattern, wherein etching the conductive pattern includes using the second insulation pattern as an etch mask together with the preliminary sacrificial pattern.

3. The method as claimed in claim 1, further comprising forming a top electrode pattern on the variable resistive pattern.

4. The method as claimed in claim 1, wherein a sidewall of the conductive pattern is in contact with the sidewall of the first insulation pattern, and a top surface of the first insulation pattern is located above a top surface of the conductive pattern.

5. The method as claimed in claim 1, further comprising:
forming an interlayer insulation pattern between the substrate and the conductive pattern, such that the interlayer insulation pattern includes openings that expose a portion of the substrate; and
forming selection elements in the respective openings.

6. The method as claimed in claim 5, wherein the selection elements are arrayed in at least two columns that are parallel with the second direction when viewed from a plan view, and forming the conductive pattern includes forming portions of the conductive pattern such that each of the portions of the conductive pattern at least partially overlaps a first selection element and a second selection element, the first and second selection elements being from respective first and second columns of the at least two columns.

7. The method as claimed in claim 5, wherein forming the conductive pattern and the first insulation pattern includes:
forming a conductive layer on the substrate including the selection elements;
forming a third insulation pattern on the conductive layer, such that the third insulation pattern extends along the second direction;
patterning the conductive layer using the third insulation pattern as an etch mask to form the conductive pattern;
forming the first insulation pattern between portions of the third insulation pattern; and
removing the third insulation pattern to form a trench that exposes the conductive pattern.

8. The method as claimed in claim 7, further comprising forming an ohmic pattern in the respective openings, such that the ohmic pattern is between the respective selection elements and the conductive pattern.

9. The method as claimed in claim 8, wherein etching the conductive pattern to form the preliminary bottom electrode pattern includes at least partially etching an upper portion of the ohmic pattern and an upper portion of the interlayer insulation pattern.

10. The method as claimed in claim 7, wherein the third insulation pattern is formed of a material having an etch selectivity with respect to the first insulation pattern.

11. The method as claimed in claim 7, wherein, after forming the preliminary bottom electrode pattern:
the trench extends into a region between two portions of the preliminary bottom electrode pattern, and
the method further comprises forming a fourth insulation pattern that fills the trench.

12. The method as claimed in claim 11, wherein forming the fourth insulation pattern includes exposing the preliminary sacrificial pattern using a planarization process.

13. The method as claimed in claim 11, further comprising forming a second insulation pattern covering a sidewall of the preliminary sacrificial pattern prior to formation of the preliminary bottom electrode pattern, wherein:
etching the conductive pattern includes using the second insulation pattern as an etch mask together with the preliminary sacrificial pattern, and
the sacrificial pattern is formed of a material having an etch selectivity with respect to the first, second and fourth insulation pattern.

14. The method as claimed in claim 7, wherein:
forming the conductive layer includes sequentially forming first and second conductive layers on the substrate having the selection elements, and
the second conductive layer is formed of a material having a resistivity greater than a resistivity of the first conductive layer.

15. The method as claimed in claim 1, wherein the preliminary sacrificial pattern is formed to contact the sidewall of the first insulation pattern using a spacer formation process.

16. The method as claimed in claim 6, wherein etching the conductive pattern includes etching the portions of the conductive pattern such that each of the portions of the conductive pattern is formed into at least two portions of the preliminary bottom electrode pattern.

* * * * *